United States Patent
Kimura

(10) Patent No.: US 7,907,072 B1
(45) Date of Patent: Mar. 15, 2011

(54) DIGITAL-TO-ANALOG CONVERTER

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 77 days.

(21) Appl. No.: 12/552,289

(22) Filed: Sep. 2, 2009

(51) Int. Cl.
*H03M 1/66* (2006.01)
(52) U.S. Cl. ............... 341/136; 341/144; 323/316
(58) Field of Classification Search ........... 323/315, 323/316; 341/133, 136, 144, 145, 153
See application file for complete search history.

(56) References Cited

U.S. PATENT DOCUMENTS

| | | | |
|---|---|---|---|
| 6,842,132 B2 * | 1/2005 | Schafferer | 341/144 |
| 6,844,835 B2 * | 1/2005 | Kao | 341/136 |
| 2003/0001656 A1 * | 1/2003 | Tucholski et al. | 341/136 |
| 2004/0257251 A1 * | 12/2004 | Hsueh | 341/136 |
| 2008/0136694 A1 * | 6/2008 | Imai | 341/144 |
| 2009/0015454 A1 * | 1/2009 | Sugai | 341/144 |
| 2009/0167579 A1 * | 7/2009 | Kawano | 341/135 |

OTHER PUBLICATIONS

English language abstracts of JP 1997-191252, JP 2002-009623, and JP 2007-336540.

* cited by examiner

*Primary Examiner* — Howard Williams
(74) *Attorney, Agent, or Firm* — Charles Bergere

(57) ABSTRACT

A DAC unit, connected to a current supply transistor, includes first control transistors connected in parallel to each other, with each being connected in series to the current supply transistor. The first control transistors drive currents at different current values in response to a bias voltage. The DAC unit also includes second control transistors connected in parallel to each other, with each being connected in series to the current supply transistor. Each second control transistor drives the current having the same current value as one of the first control transistors in response to the single bias voltage. The first and second control transistors driving the currents having the same current value operate in a complementary manner based on part of a digital code. The DAC unit generates an output current by selectively combining at least one of the currents driven by the first control transistors.

18 Claims, 5 Drawing Sheets

DIGITAL-TO-ANALOG CONVERTER

BACKGROUND OF THE INVENTION

The present invention relates to a digital-to-analog converter (DAC).

Digital-to-analog converters (DAC) are well known circuits used to convert digital signals to analog signals. One example of a conventional DAC is a current summing DAC, such as that described in Japanese Laid-Open Patent Publication No. 9-191252. The DAC shown in FIG. 1 of the publication has a 7-bit structure and is divided into a first DAC unit 11, which includes control transistors Q1, Q2, and Q3 for the lower three bits, and a second DAC unit 12, which includes control transistors Q4, Q5, Q6, and Q7 for the higher four bits. The DAC also includes a first drive transistor Q11, which forms a current mirror with each control transistor of the first DAC unit 11, and a second drive transistor Q12, which forms a current mirror with each control transistor of the second DAC unit 12. The first and second drive transistors Q11 and Q12 are respectively connected to first and second current sources Q21 and Q22, which form a current mirror with each other and supply each other with currents having different current values.

With this structure, the size of the control transistors located at the higher bit side (second DAC unit 12) and the size of the control transistors located at the lower bit side (first DAC unit 11) are independently adjusted based on the current ratio of the first and second current sources Q21 and Q22. This allows for reduction in the size of the control transistor Q7 for the highest bit that occupies the largest area in the layout of the transistors. However, this structure has a shortcoming in that a glitch is produced in the output voltage of the DAC when a digital code changes. That is, a glitch is produced when the gate-source voltage of each of the first and second drive transistors Q11 and Q12 fluctuates due to charging and discharging at the gate of the first drive transistor Q11 and the gate of the second drive transistor Q12. This is because changes in the gate-source voltage of each of the first and second drive transistors Q11 and Q12 change the values of currents I11 and I12, which flow to the transistors Q11 and Q12.

Another example of a DAC is a master-slave DAC, such as described in Japanese Laid-Open Patent Publication No. 2002-9623. FIG. 1 of the publication shows a DAC including a master circuit at a higher bit side and a slave circuit at a lower bit side. The master and slave circuits each employ an R-2R ladder, weighted current distribution structure. However, high operational power is required to drive each current mirror of the master circuit and slave circuit and obtain an output voltage with high linearity.

Japanese Laid-Open Patent Publication No. 2007-336540 describes a DAC structure that generates an analog signal by adding the currents distributed by a current distributor in accordance with a digital code. In such structure, however, the current distribution unit is formed by a plurality of cascode circuits to obtain a large current distribution ratio. Thus, in the same manner as Japanese Laid-Open Patent Publication No. 2002-9623, high operational power is necessary.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
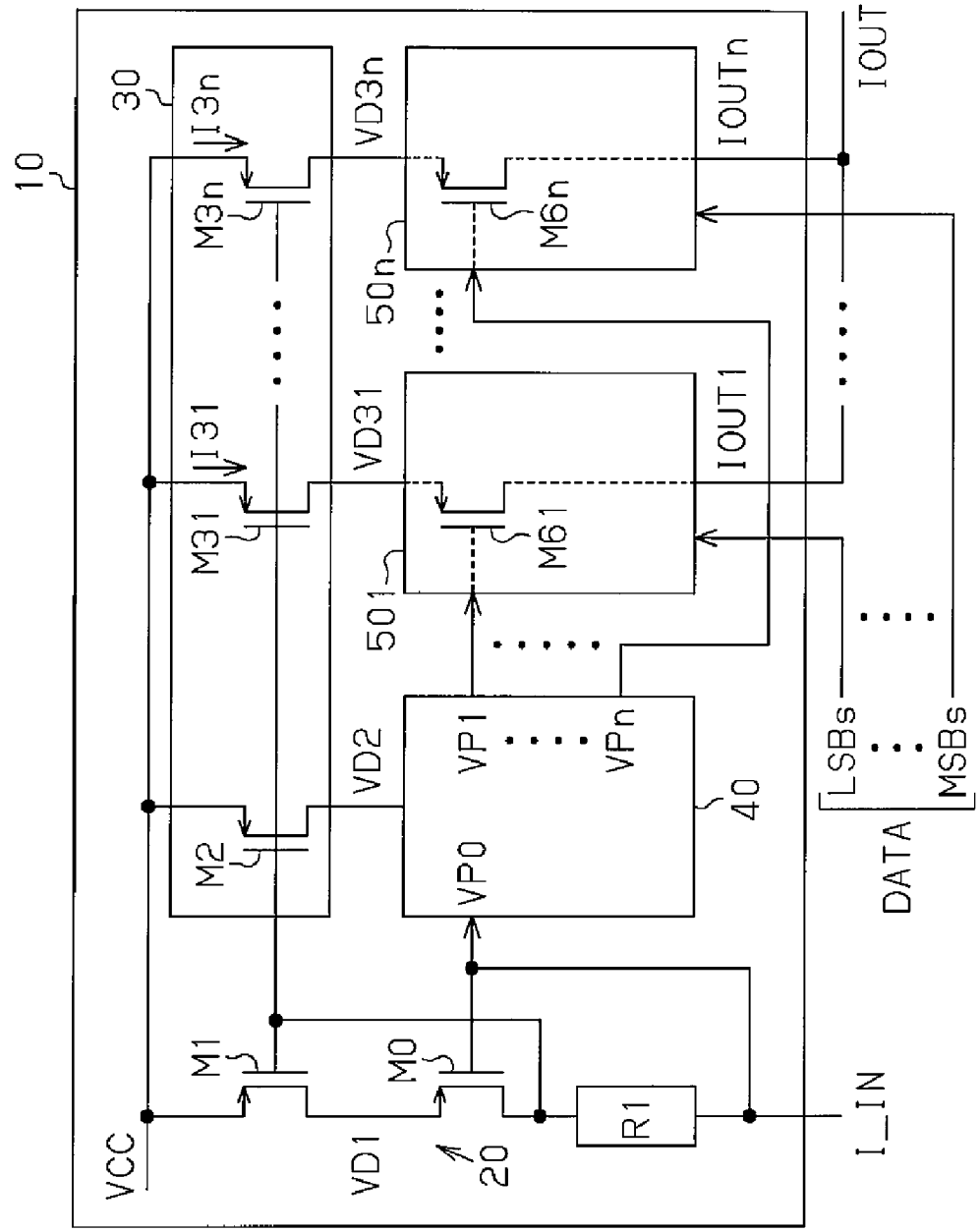
FIG. 1 is a schematic circuit block diagram of a digital-to-analog converter (DAC) in accordance with an embodiment of the present invention.

In the drawings, like numerals are used for like elements throughout.

The present invention provides a compact DAC that prevents glitches from being produced when a digital code changes and is operable with low power. One aspect of the present invention is a digital-to-analog converter for generating an output current corresponding to a digital code. The digital-to-analog converter includes a current supply transistor that generates current having a predetermined current value. A DAC unit receives the current generated by the current supply transistor. The DAC unit includes a plurality of first control transistors connected in parallel to each other. Each of the plurality of first control transistors is connected in series to the current supply transistor. The plurality of first control transistors drive currents having different current values in response to a single bias voltage. A plurality of second control transistors are connected in parallel to each other. Each of the plurality of second control transistors is connected in series to the current supply transistor and drives current having a current value that is the same as one of the plurality of first control transistors in response to the single bias voltage. The first and second control transistors that drive the currents having the same current value operate in a complementary manner based on part of the digital code. The DAC unit generates the output current by selectively combining at least one of the currents driven by the plurality of first control transistors.

A further aspect of the present invention is a digital-to-analog converter for generating an output current corresponding to a digital code. The digital-to-analog converter includes a first current supply transistor which generates a first supply current. A second current supply transistor generates a second supply current. A first DAC unit generates a first output current and includes at least first and second control transistors. The first and second control transistors operate in a complementary manner based on a first portion of the digital code and retrieves at least some of the first supply current from the first current supply transistor to generate a first drive current in response to a first bias voltage. The first control transistor outputs the first drive current as at least some of the first output current. A second DAC unit generates a second output current and includes at least third and fourth control transistors. The third and the fourth control transistors operate in a complementary manner based on a second portion of the digital code and retrieves at least some of the second supply current from the second current supply transistor to generate a second drive current in response to a second bias voltage. The third control transistor outputs the second drive current as at least some of the second output current. The first output current and the second output current are selectively combined to generate the output current of the digital-to-analog converter.

Another aspect of the present invention is a reference current generation circuit including a digital-to-analog converter which generates an output current corresponding to a digital code based on an input current. A reference current generation unit generates a reference current based on a difference of the input current and the output current. The digital-to-analog converter corrects an error of the input current based on a correction value of the digital code so as to cancel an error in the reference current.

Other aspects and advantages of the present invention will become apparent from the following description, taken in conjunction with the accompanying drawings, illustrating by way of example the principles of the invention.

An embodiment of a digital-to-analog converter (DAC) 10 in accordance with the present invention will now be discussed with reference to FIGS. 1 to 4. As shown in FIG. 1, the DAC 10 includes a current drive unit 20. The current drive unit 20 includes an input transistor M0, which is connected in series to a resistor R1, and a drive transistor M1, which is cascode-connected to the input transistor M0. The input transistor M0 and the drive transistor M1 are each formed by a p-type MOS transistor. The drive transistor M1, which is connected to a power supply that supplies an operational voltage VCC, is driven by a voltage generated at a connection node of the input transistor M0 and the resistor R1. The input transistor M0 is driven by a bias voltage VP0 corresponding to an input current I_IN flowing to the transistor M0 and the resistor R1.

The DAC 10 also includes a current supply unit 30 connected to the current drive unit 20. The current supply unit 30 includes current supply transistors M2, M31, ..., and M3$n$, each being a p-type MOS transistor and forming a current mirror with the drive transistor M1. The drive transistor M1 and the current supply transistors M2, M31, ..., and M3$n$ are have the same transistor size. In this specification, the term "size" refers to the transistor size related to the current driving capability. The current supply transistors M31, ..., and M3$n$ may also be formed with different sizes. For example, the sizes of the current supply transistors M31, ..., and M3$n$ may be increased in order from the transistor M31 to the transistor M3$n$. In such a case, the sizes of the transistors M31, ..., and M3$n$ are optimized in accordance with the supply current amount (current weighting ratio). The current supply unit 30 may be formed by just the current supply transistor M2 and the current supply transistor M31. The current supply transistors M32, M33, ..., M3$n$ are added when necessary in accordance with the resolution required for the DAC 10.

The DAC 10 further includes a bias circuit 40 connected to the input transistor M0 and the current supply transistor M2. The bias circuit 40 generates a plurality of reference bias voltages VP1, ..., and VP$n$ based on the bias voltage VP0 and the current supplied from the transistor M2. The reference bias voltages VP1, ..., and VP$n$ are set as different values. In the preferred embodiment, the reference bias voltages VP1, ..., and VP$n$ are set so as to become smaller at a predetermined ratio in order from the voltage VP1 to the voltage VP$n$. However, the bias circuit 40 may generate only one reference bias voltage VP1. The bias circuit 40 generates first to nth reference bias voltages VP1, ..., and VP$n$ in accordance with the resolution required for the DAC 10.

The DAC 10 also includes a plurality of DAC units 501, ..., and 50$n$. The DAC units 501, ... 50$n$ receive digital code DATA, which includes a plurality of bits, and generates an output current IOUT, which corresponds to the value of the digital code DATA. The DAC units 501, ... and 50$n$ function as conversion units for converting a digital signal to an analog signal. The bias circuit 40 supplies the reference bias voltages VP1, ..., and VP$n$ to the DAC units 501, ..., and 50$n$. The DAC units 501, ..., and 50$n$, which are respectively connected to the current supply transistors M31, ..., and M3$n$, retrieve currents I31, ..., and I3$n$ of different current values from the transistors M31, ..., and M3$n$ in accordance with the current weighting ratio set for the DAC units 501, ..., and 50$n$. The values of the currents I31, ..., and I3$n$ set to become greater in order from the current I31 to the current I3$n$ (I31< ... <I3$n$)

In the preferred embodiment, each DAC unit 501, ..., 50$n$ has a resolution of two bits or greater. In this case, the first DAC unit 501 generates a first output current IOUT1 based on the value of the least significant bit (LSBs) of two digits or greater. The nth DAC unit 50$n$ generates an nth output current IOUT$n$ based on the value of the most significant bit (MSBs) of two digits or greater. The current output terminal of each of the DAC units 501, ..., and 50$n$ are connected to a common output terminal that functions as an output terminal for the DAC 10, which outputs the output current IOUT corresponding to the value of the digital code DATA. In this case, the value of the output current IOUT is expressed as the sum of the output currents IOUT1, ..., and IOUT$n$. The DAC 10 may be formed by only one DAC unit. For example, the DAC unit 501 may generate the output current IOUT based on the value of the digital code DATA (LSB to MSB). The quantity of the DAC units 501, ..., and 50$n$ is determined in accordance with the resolution required for the DAC 10. In the present invention, the resolution of each of the DAC units 501, ..., and 50$n$ is not limited to two bits or greater.

The circuit structure of the DAC units 501, ..., 50$n$ will now be discussed.

Figure 2:
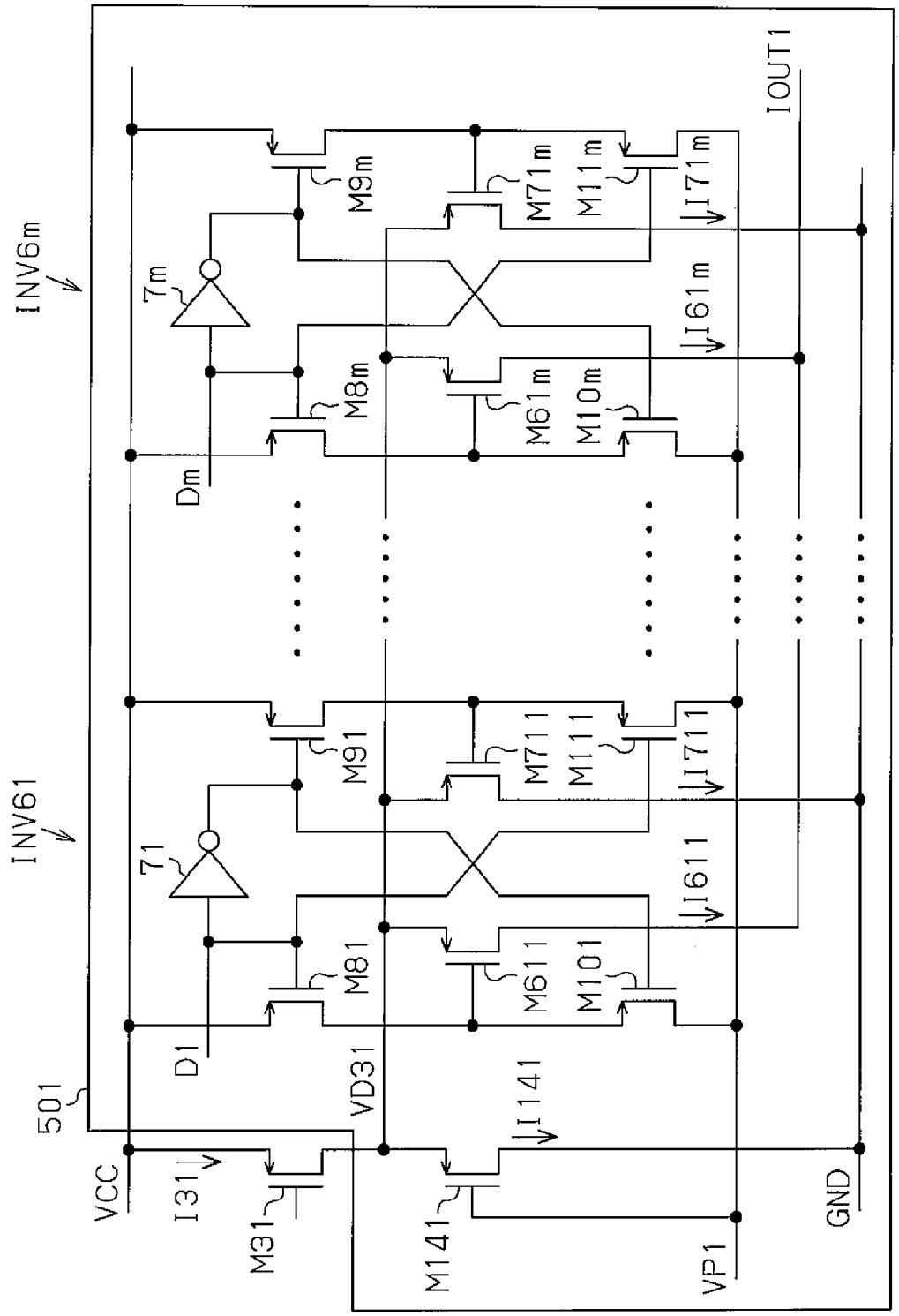
FIG. 2 is a schematic circuit diagram showing one of a plurality of DAC units arranged in the DAC of FIG. 1.

First, among the DAC units 501, ..., and 50$n$, the structure of the first DAC unit 501 of will be discussed with reference to FIG. 2. The second to nth DAC units 502, ..., and 50$n$ are formed in the same manner as the first DAC unit 501. As shown in FIG. 2, the first DAC unit 501 includes inverters INV61, ..., and INV6$m$, which generate the first output current IOUT1 based on the values of the bits D1, ..., and D$m$, which are the LSBs of the digital code DATA.

The inverters INV61, ..., and INV6$m$, which are arranged in correspondence with the bits D1, ..., and D$m$, generate weighting currents I611, ..., and I61$m$, which differ from one another in accordance with the positions of the bits D1, ..., and D$m$. Each of the inverters INV61, ..., INV6$m$ includes a current input terminal, which is connected to the drain of the current supply transistor M31, and a current output terminal, which outputs the current retrieved from the drain of the current supply transistor M31 as the weighting current corresponding to the bit position. The current output terminals of the inverters INV61, ..., and INV6$m$ are connected to a common output terminal functioning as a current output terminal of the first DAC unit 501 that outputs the first output current IOUT1. Therefore, the inverters INV61, ..., and INV6$m$ of the first DAC unit 501 are connected in parallel to one another. The bias circuit 40 commonly applies the first reference bias voltage VP1 to the inverters INV61, ..., and INV6$m$.

The first DAC unit 501 also includes, if necessary, a current adjustment transistor M141, which is a p-type MOS transistor that is cascode connected to the current supply transistor M31. The current adjustment transistor M141 includes a source connected to the drain of the current supply transistor M31, a gate responsive to the first reference bias voltage VP1, and a drain connected to the ground GND. The current adjustment transistor M141 determines the current weighting ratio of the DAC units 501, ..., and 50$n$ by adjusting the current amount of the first output current IOUT1. The operation of the current adjustment transistor M141 will be discussed later.

The inverters INV61, ..., and INV6m are all formed in the same manner except for the point in which they generate different weighting currents I611, ..., and I61m. The first inverter INV61, which generates the weighting current I611 corresponding to the bit D1 (LSB), will now be described in detail.

The first inverter INV61 includes an inverter circuit 71, switching transistors M81, M91, M101, and M111, and control transistors M611 and M711. Each of the transistors M81, M91, M101, M111, M611, and M711 is a p-type MOS transistor. The inverter circuit 71 generates an inverted value of the value of the bit D1.

The switching transistor M81 and the switching transistor M101 are connected in series to each other. The voltage VCC is applied to the source of the switching transistor M81, and the first reference bias voltage VP1 is applied to the drain of the switching transistor M101. In the same manner, the switching transistor M91 and the switching transistor M111 are connected in series to each other. The voltage VCC is applied to the source of the switching transistor M91, and the first reference bias voltage VP1 is applied to the drain of the switching transistor M111. The voltage corresponding to the value of the bit D1 is applied to the gate of the switching transistor M81 and the gate of the switching transistor M111. The voltage corresponding to the inverted value of the value of the bit D1 is applied to the gate of the switching transistor M91 and the gate of the switching transistor M101. Therefore, the switching transistors M91 and M101 are deactivated when the switching transistors M81 and M111 are activated. On the other hand, the switching transistors M91 and M101 are activated when the switching transistors M81 and M111 are deactivated.

The control transistor M611 is cascode-connected to the current supply transistor M31. The control transistor M611 includes a gate connected to a node between the switching transistors M81 and M101, a source functioning as the current input terminal of the first inverter INV61, and a drain functioning as the current output terminal of the first inverter INV61.

The control transistor M611 drives a predetermined current in response to the first reference bias voltage VP1. For example, when the value of the bit D1 is "1", the switching transistors M91 and M101 are activated. This activates the control transistor M611 with the first reference bias voltage VP1 supplied via the switching transistor M101. In this case, the control transistor M611 retrieves the current I611 corresponding to its size from the drain of the current supply transistor M31 and outputs the current I611 to the current output terminal of the first inverter INV61 as the weighting current corresponding to the bit D1 (LSB). On the other hand, when the value of the bit D1 is "0", the voltage VCC is applied to the gate of the control transistor M611 through the switching transistor M81. Therefore, the control transistor M611 is not activated.

The control transistor M711 is cascode-connected to the current supply transistor M31. The control transistor M711 includes a gate connected to a node between the switching transistors M91 and M111, a source connected to the source of the control transistor M611, and a drain connected to the ground GND. That is, the control transistor M711 is connected in parallel to the current adjustment transistor M141.

The control transistor M711 has the same size (i.e., same current driving capability) as the control transistor M611. The control transistor M711 also drives the current in response to the first reference bias voltage VP1. More specifically, when the value of the bit D1 is "0", the switching transistors M81 and M111 are activated. This activated the control transistor M711 with the first reference bias voltage VP1 supplied through the switching transistor M111. In this case, the control transistor M711 retrieves the current I711 corresponding to its size from the drain of the current supply transistor M31 and directs the current I711 to the ground GND. On the other hand, when the value of the bit D1 is "1", the voltage VCC is applied to the gate of the control transistor M711 through the switching transistor M91. Therefore, the control transistor M711 is not activated.

The control transistor M611 and the control transistor M711 operate in a manner complementary to each other. Thus, the current (weighting current) I611 flowing to the control transistor M611 and the current I711 flowing to the control transistor M711 are alternately generated in accordance with the value of the bit D1. The values of the currents I611 and I711 are respectively determined by the sizes of the control transistors M611 and M711. The control transistors M611 and M711 have the same size, as described above, and the same current density. Thus, the values of the currents I611 and I711 are the same. Therefore, the value of the current I31 flowing to the current supply transistor M31 does not change regardless of whether the value of the bit D1 is "1" or "0". Furthermore, since the value of the current flowing to each of the transistors M611 and M711 is the same, the voltage VD31 at the drain of the current supply transistor M31 remains constant regardless of the value of the bit D1.

Although there is no detailed circuit diagram, the second inverter INV62 includes control transistors M612 and M712, which also have the same size and operate in a manner complementary to each other. However, the control transistor M612 (M712) of the second inverter INV62 has a size that is larger than the control transistor M611 (M711) of the first inverter INV61. The control transistor M612 (M712) and the control transistor M611 (M711) have the same current density and thus generation currents proportional to size. In the preferred embodiment, the size of the control transistor M612 (M712) is two times greater than the control transistor M611 (M711). The operation and other parts are the same as the first inverter INV61.

In response to the value "1" of the bit D2, which is the next digit of the bit D1, the second inverter INV62 generates a weighting current I612 corresponding to the bit D2. The value of the weighting current I612 is dependent on the size of the control transistor M612 and is two times greater than the value of the weighting current I611, which generated by the first inverter INV61. In this case as well, the value of the current I31 does not change regardless of whether the bit D2 is "1" or "0", and the drain voltage VD31 remains constant.

In the same manner, in response to bit Dm, the mth inverter INV6m generates a weighting current I61m dependent on the size of the control transistor M61m. The value of the weighting current I61m is $2^{(m-1)}$ times greater than the weighting current I611 of the first inverter INV61. The control transistors M61m and M71m each have the same current value. Thus, the drain voltage VD31 remains constant regardless of the value of the bit Dm. In the inverters INV61, ..., and INV6m of the first DAC unit 501, the relationship between the sizes of the control transistor M611, ..., M61m and the values of the weighting current I611, ..., I61m is as shown below.

I611:I612: ......:I61m
=M611:M612: ......:M61m
=1:2: ......:$2^{(m-1)}$

In the above relational equation, M611:M612: ......: M61m represents the size ratio of the control transistors M611, ..., and M61m. The first output current IOUT1 output from the current output terminal of the first DAC unit 501 is obtained by adding the weighting currents I611, ..., and I61*m* and expressed by the equation shown below.

$$IOUT1 = D1 \times I611 + D2 \times I612 + \ldots + Dm \times I61m$$

The first output current IOUT1 becomes maximum when each of the bits D1, ..., and Dm is "1". The current adjustment transistor M141 is connected in series to the current supply transistor M31 and in parallel to the control transistors M611, ..., and M61*m*. The current adjustment transistor M141 directs some of the current I31, which flows to the current supply transistor M31, to the ground GND as current I141. Therefore, the maximum value of the first output current IOUT1 is "I31-I141". In this case, the first output current IOUT1 is expressed with the equation shown below.

$$IOUT1 = (I31 - I141) \times DATA1/(2^{m-1})$$

Here, DATA1 is a decimal value of a code (bit D1, ..., and Dm) provided to the first DAC unit 501. The current adjustment transistor M141 retrieves some of the current I31 as the current I141 to adjust the value of the first output current IOUT1. This adjusts the ratio of the current I141 and the first output current IOUT1 with the current adjustment transistor M141, and the first output current IOUT1 is generated with an optimal value corresponding to the resolution of the first DAC unit 501.

Each of the second to the nth DAC units 502, ... and 50*n* are formed in the same manner as the first DAC unit 501. However, the second DAC unit 502 is driven with a second reference bias voltage VP2, which is lower than the first reference bias voltage VP1. In the same manner, the nth DAC unit 50*n* is driven with an nth reference bias voltage VP*n*, which is lower than the (n-1)th reference bias voltage VP(n-1).

The second DAC unit 502 generates a second output current IOUT2 based on the bit D(m+1) of the next digit of the bit Dm and one or more of the following bits. The value of the current I32 flowing to the current supply transistor M32, which is connected to the second DAC unit 502, is set to be larger than the current I31 flowing to the current supply transistor M31 based on the current weighting ratio of the DAC units 501, ..., and 50*n*. Therefore, the second DAC unit 502 generates the second output current IOUT2 that is greater than the first output current IOUT1. In the same manner, the nth DAC unit 50*n* generates the nth output current IOUTn that is greater than the (n-1)th output current IOUT(n-1).

The second DAC unit 502 also includes control transistors M621, ... and M62*m* (not shown), which function in the same manner as the control transistors M611, ..., and M61*m* (FIG. 2) of the first DAC unit 501, and control transistors M721, ..., and M72*m* (not shown), which function in the same manner as the control transistors M711, ..., and M71*m* (FIG. 2) of the first DAC unit 501. The sizes of the control transistors M621, ..., and M62*m* (M721, ..., and M72*m*) also become greater at a ratio that is the power of two in order from the transistor M621 (M721) to the transistor M62*m* (M72*m*). The sizes of the control transistors M611, ..., and M61*m* (M711, ..., and M71*m*) of the first DAC unit 501 are independently determined from the sizes of the control transistors M621, ..., and M62*m* (M721, ..., and M72*m*) of the second DAC unit 502. Thus, in the second DAC unit 502 that is located at the higher bit side of the first DAC unit 501, the sizes of the control transistor M621, ..., M62*m* (M721, ..., M72*m*) are prevented from exponentially increasing from the first DAC unit 501. The same applies for the following nth DAC unit 50*n*. In FIG. 1, the control transistors M611, ..., and M61*m* of the first DAC unit 501 are shown as a control transistor group M61, and the control transistors M6*n*1, ..., and M6 nm of the nth DAC unit 50*n* are shown as a control transistor group M6*n*.

In the preferred embodiment, the current weighting ratio of the DAC units 501, ..., and 50*n* is adjusted by changing the control transistor size for each DAC unit instead of cascade-connecting a plurality of transistors (current supply transistors) to the power supply. Thus, the ratio of the currents I31, ..., and I3*n* may be increased even if the quantity of current supply transistors connected in series to each DAC unit is reduced. In particular, a single current supply transistor is provided for each of the DAC units 501, ..., and 50*n* in the preferred embodiment. Thus, the size of the current supply transistor and the size of the control transistor may be selected with a higher degree of freedom. Accordingly, the quantity of cascaded transistors may be reduced, the DAC 10 may be miniaturized, and the operational power may be lowered even when realizing a DAC having a high resolution.

Figure 3:
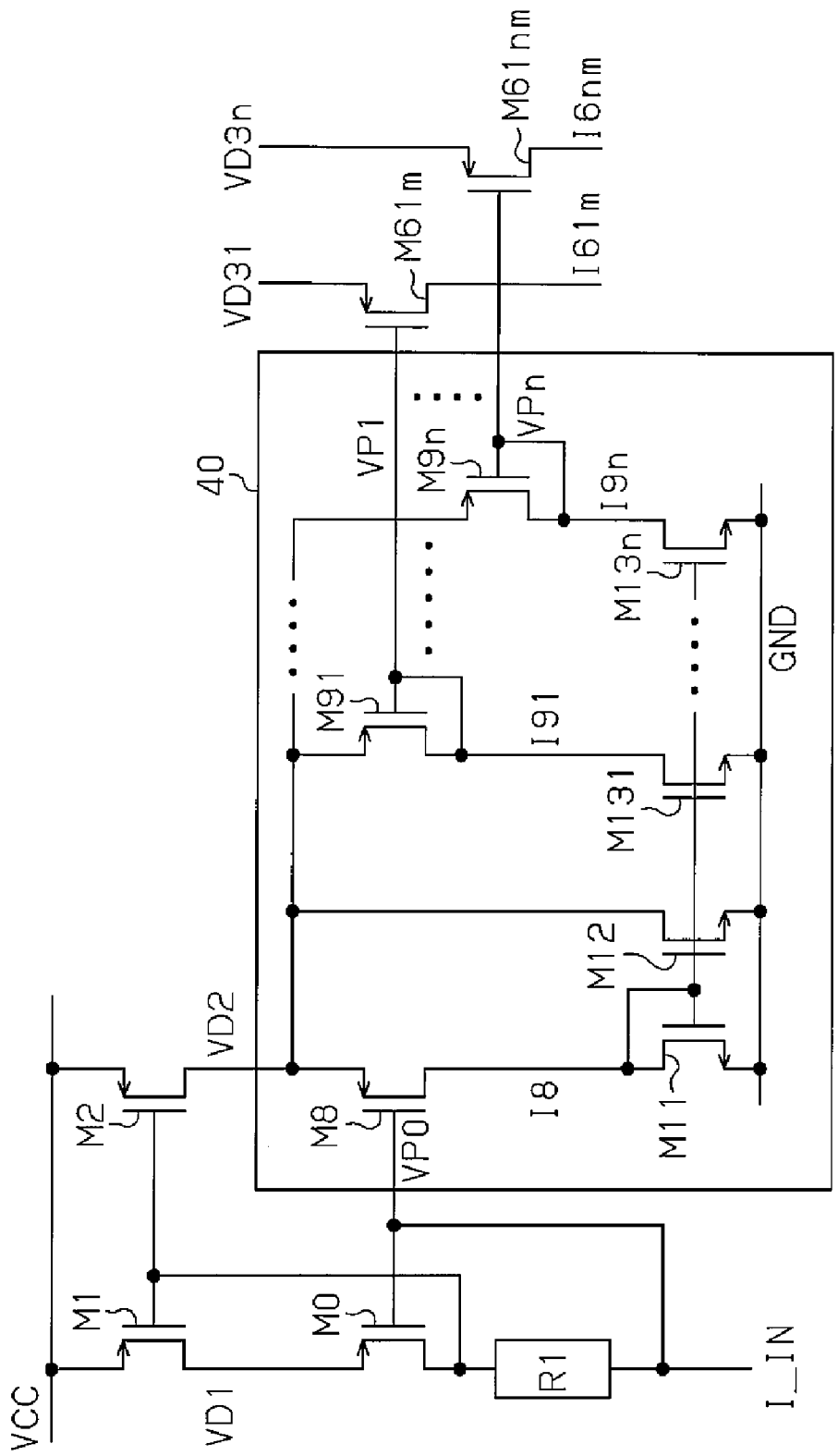
FIG. 3 is a schematic circuit diagram of a bias circuit arranged in the DAC of FIG. 1.

The bias circuit 40 will now be described with reference to FIG. 3. The bias circuit 40 includes a reference transistor M8, which is cascode-connected to the current supply transistor M2, and a current source transistor M11, which is connected in series to the transistor M8. The bias circuit 40 also includes current source transistors M12, M131, ..., and M13*n*, which form a current mirror with the transistor M11, and bias adjustment transistors M91, ..., and M9*n*, which are respectively connected in series to the transistors M131, ..., and M13*n*. Each of the transistors M8, M91, ..., and M9*n* is formed by a p-type MOS transistor, and each of the transistor M11, M12, M131, ..., and M13*n* is formed by an n-type MOS transistor.

The reference transistor M8 generates a reference current I8 (I8=I_IN×M8/M5), which corresponds to the value of the input current I_IN (bias voltage VP0) and the size ratio of the input transistor M0 and the reference transistor M8. The gate-source voltage of the input transistor M0 and the gate-source voltage of the reference transistor M8 are thus equal. Therefore, the drain voltage VD1 of the drive transistor M1, which is the source voltage of the input transistor M0, and the drain voltage VD2 of the current supply transistor M2, which is the source voltage of the reference transistor M8, are also equal. The drain voltage VD2 of the transistor M2 is commonly applied to the sources of the bias adjustment transistors M91, ..., and M9*n*.

The current source transistor M12 is connected between the ground GND and the drain of the current supply transistor M2. For instance, the current source transistor M12 has a size that is larger than the current source transistor M11. The current source transistors M131, ..., and M13*n* are formed such that the size becomes larger in order from the transistor M131 to the transistor M13*n*. The transistor M12 is not essentially required.

The bias adjustment transistors M91, ..., and M9*n*, which are each diode-connected, are formed so that the size becomes larger in order from the transistor M91 to the transistor M9*n*. The bias adjustment transistors M91, ..., and M9*n* generate reference bias currents I91, ..., and I9*n* based on the size ratio of the current source transistors M131, ..., and M13*n*. The values of the reference bias currents I91, ..., and I9*n* are determined in a manner dependent on the current weighting ratio of the DAC units 501, ..., and 50*n* and become smaller in order from the current I91 to the current I9*n*. Thus, the reference bias voltages VP1, ..., and VP*n* that decrease at a predetermined ratio are supplied to the gates of the bias adjustment transistors M91, ..., and M9*n*. The reference bias voltages VP1, ..., and VP*n* are respectively supplied to the DAC units 501, ..., and 50*n*.

The first reference bias voltage VP1 is commonly used for the control transistors M611, ..., and M61m of the first DAC unit 501. In FIG. 3, only the control transistor M61m is shown, and the switching transistor M10m of FIG. 2 is not shown. As described above, the sizes of the control transistors M611, ..., and M61m increase in order at a ratio of that is the power of two. Thus, the magnitude of the first reference bias voltage VP1 is determined based on the size of the largest control transistor M61m so as to ensure a sufficient level for driving each of the control transistors M611, ..., and M61m. Specifically, the magnitude of the first reference bias voltage VP1 is adjusted by the size of the bias adjustment transistor M91 so as to satisfy the relational equation shown below.

$$I91:I61m=M91:M61m$$

In the above relational equation, M91:M61m represents the size ratio of the bias adjustment transistor M91 and the control transistor M61m. When the relational equation is satisfied, the gate-source voltage of the bias adjustment transistor M91 and the gate-source voltage of the control transistor M61m are equal. Thus, the drain voltage M2 of the current supply transistor VD2, which is the source voltage of the bias adjustment transistor M91, and the drain voltage VD31 of the current supply transistor M31 (see FIG. 2), which is the source voltage of the control transistor M61m, are also equal. That is, VD1=VD2=VD31 is satisfied. This relationship is maintained even if the value of the digital code DATA changes. This is because the gate-source voltage of the bias adjustment transistor M91 and the gate-source voltage of the control transistor M61m remain constant regardless of changes in the value of the digital code DATA. Therefore, the current value of the current I31 flowing to the current supply transistor M31 also does not change.

In the same manner, the nth reference bias voltage VPn is commonly used for the control transistors M6n1, ..., and M6 nm of the nth DAC unit 50n. FIG. 3 shows only the transistor M6 nm, which has the largest size among of the control transistors M6n1, ..., and M6nm. In this case, the size of the bias adjustment transistor M9n for adjusting the magnitude of the nth reference bias voltage VPn is also determined so as to satisfy the relational equation of I9n:I6nm=M9n:M6 nm. Therefore, VD1=VD2=VD31= ... =VD3n is satisfied for the same reason. Here, VD3n is the drain voltage of the current supply transistor M3n (see FIG. 1). This relationship is maintained regardless of whether the value of the digital code DATA changes. Thus, the current weighting ratio of the currents I31, ..., and I3n remains constant regardless of a change in the value of the digital code DATA. This prevents glitches from being produced in the DAC 10 of the preferred embodiment when a digital code is changed.

Figure 4:
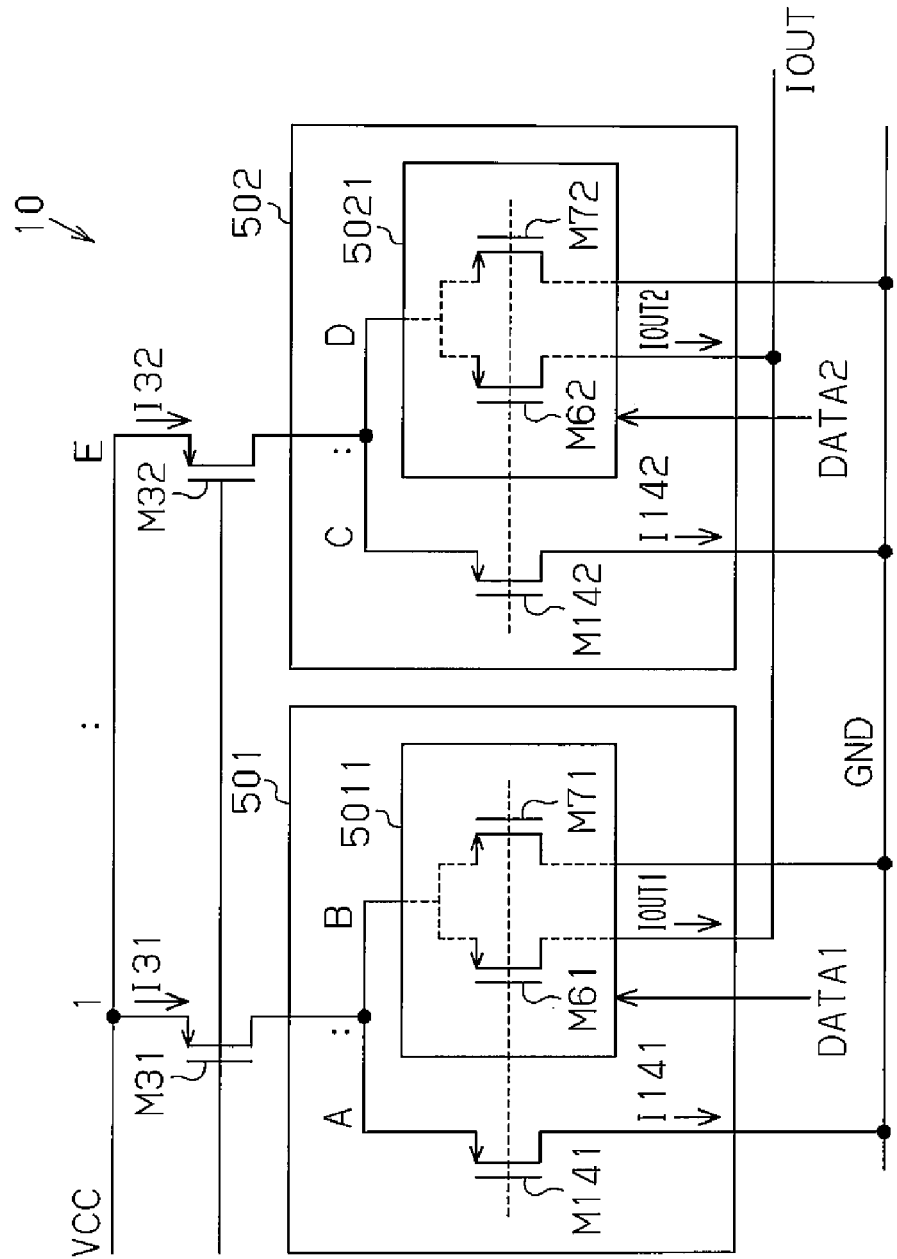
FIG. 4 is a schematic circuit diagram illustrating a process for setting a current weighting ratio for a plurality of DAC units arranged in the DAC of FIG. 1.

The characteristics of the DAC 10 will be supplemented with reference to FIG. 4. As described above, the DAC units 501, ..., and 50n include the current adjustment transistor 141, ..., and 14n to adjust the magnitude of the output currents IOUT1, ..., and IOUTn, respectively (see FIG. 2). FIG. 4 shows the structure of part of the DAC 10 including the first DAC unit 501 and the second DAC unit 502. The first DAC unit 501 has a DAC main body 5011, which includes the control transistor groups M61 and M71, and the current adjustment transistor 141. The control transistor group M61 includes the control transistors M611, ..., and M61m of FIG. 2, and the control transistor group M71 includes the control transistors M711, ..., and M71m of FIG. 2. More specifically, the DAC main body 5011 is formed by the inverters INV61, ..., and INV6m (see FIG. 2). In the same manner, the second DAC unit 502 also has a DAC main body 5021, which includes the control transistor groups M62 and M72, and the current adjustment transistor 142.

The first DAC unit 501 retrieves the current I31 from the current supply transistor M31 based on the value of the code DATA1 containing the LSB and outputs the first output current IOUT1 from the DAC main body 5011. The first output current IOUT1 is equal to the current (I31-I41) flowing to the DAC main body 5011. The first output current IOUT1 takes a maximum value when the code DATA1 takes a maximum value.

The second DAC unit 502 retrieves the current I32 from the current supply transistor M32 based on the value of the code DATA2 containing the MSB and outputs the second output current IOUT2 from the DAC main body 5021. The second output current IOUT2 is equal to the current (I32-I142) flowing to the DAC main body 5021. The second output current IOUT2 takes a maximum value when the code DATA2 takes a maximum value.

A process for determining the current weighting ratio of the current I31 and the current I32 in the DAC 10 will now be discussed. It will here be assumed that the maximum value (decimal value) of the code DATA1 is "B", and the ratio of the current I141 flowing to the current adjustment transistor 141 and the current flowing to the DAC main body 5011 is "A:B". Furthermore, it will be assumed that the maximum value (decimal value) of the code DATA2 is "D", and the ratio of the current I142 flowing to the current adjustment transistor 142 and the current flowing to the DAC main body 5021 is "C:D". A, B, C, and D are positive integers. In this case, the digital code DATA (decimal value) provided to the DAC 10 is expressed with the following equation.

$$DATA=DATA1+DATA2 \times (B+1)$$

In this equation, the second term of (B+1) represents the current weighting coefficient of the second output current IOUT2 for the first output current IOUT1. Therefore, when the current weighting ratio of the current I31 and the current I32 is represented as "1:E" (E being a positive integer), the current I32 is expressed with the following equation.

$$I32=(A+B) \times E=(C+D) \times (B+1)$$

Therefore, A+B=C+D is satisfied if the current weighting ratio is set as 1:(B+1), that is, under the condition E=B+1 is satisfied. Furthermore, A=C is satisfied when the first and second DAC units 501 and 502 are formed with the same number of bits, that is, under the condition B=C is satisfied. In other words, the value of the current I141 is equal to the value of the current I142.

When forming, for example, an eight-bit DAC 10 with the requisite conditions of E=B+1 and B=D, each of the first and second DAC units 501 and 502 includes four bits. In this case, from B=D=2⁴-1=15, E=15+1=16 is derived. Therefore, the current weighting ratio of the current I31 and the current I32 is set to 1:16. The size of the control transistor groups M62 and M72 in the second DAC unit 502 is determined so as to satisfy this current weighting ratio, and the value of the second reference bias voltage VP2 is determined based on this size. As described above, under the condition of E=B+1 and B=D, E is not dependent on A and C and A=C is satisfied. Therefore, the condition of A=C=0 may also be used. In this case, the current adjustment transistors 141 and 142 are not necessary.

Alternatively, the DAC 10 may be formed without using the requisite conditions of E=B+1 and B=D. In this case, the setting of the current weighting ratio is facilitated by using the current adjustment transistors 141 and 142. For instance, when forming a seven-bit DAC 10 using a four-bit first DAC unit 501 (B=2⁴−1=15) and a three-bit second DAC unit 502 (B=2³−1=7), it is more convenient to use the condition of A=C=1 rather than the condition of A=C=0. This is because E=8 is derived from the relational equation of (A+B)×E=(C+D)×(B+1) when using the condition of A=C=1. However, if the condition of A=C=0 is used, the value of E becomes 7.4666 . . . . Thus, it becomes difficult to set an accurate weighting ratio. In this case, A and C may be different values. For instance, the condition of A=1 and C=0 may be used. The use of the current adjustment transistors 141 and 142 increases the degree of freedom of design for the DAC 10.

Figure 5:
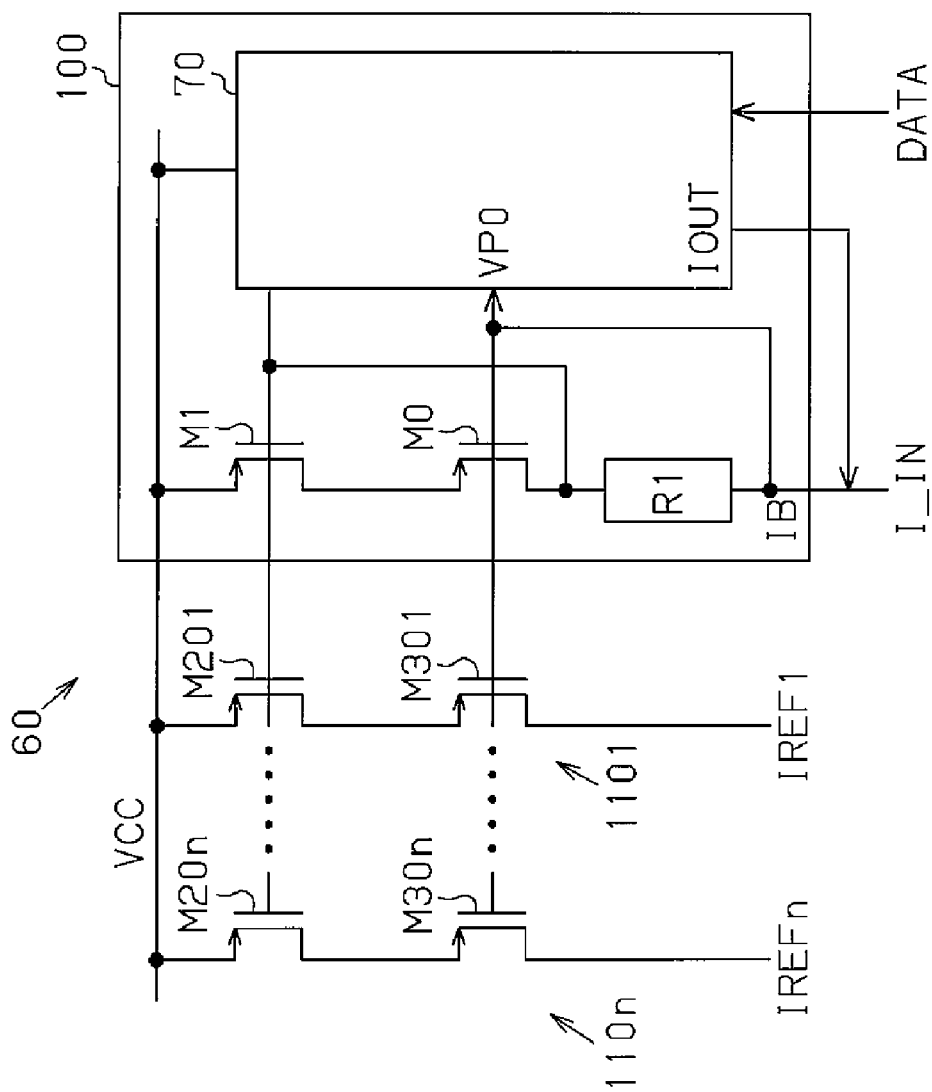
FIG. 5 is a schematic circuit block diagram of a reference current generation circuit to which the DAC of FIG. 1 is applied.

One example of a circuit to which the DAC 10 of FIG. 1 is applied will now be described. FIG. 5 shows a reference current generation circuit 60 that uses a DAC 100, which is formed in the same manner as the DAC 10. As shown in FIG. 5, a block 70 includes the current supply unit 30 and the DAC units 501, . . . , and 50n of FIG. 1. The output current LOUT of the block 70 is generated by the DAC units 501, . . . , and 50n based on the digital code DATA. The value of the output current LOUT is equivalently expressed with the equation shown below.

$$IOUT = IB \times DATA \times K1 \quad \text{(equation 1)}$$

In equation 1, IB represents the value of the current flowing through the transistors M1 and M01 and the resistor R1 of the DAC 100, DATA is the value of the digital code, and K1 is the current ratio coefficient representing the value of the output current IOUT for the current value IB.

The output terminal of the block 70 that outputs the output current LOUT is connected to the resistor R1. Therefore, the value of the input current I_IN of the DAC 100 is expressed with the equation described below.

$$I\_IN = IB + IOUT \quad \text{(equation 2)}$$

The reference current generation circuit 60 includes the DAC 100 and a plurality of reference current generation units 1101, . . . , and 110n. The reference current generation unit 1101 includes a p-type MOS transistor M301, which is cascode-connected to a p-type MOS transistor M201. In the same manner, the reference current generation unit 110n includes a p-type MOS transistor M30n, which is cascode-connected to a p-type MOS transistor M20n. The gates of the transistors M201, . . . , and M20n are connected to the gate of the transistor M1 in the DAC 100. The sources of the transistors M201, . . . , and M20n are connected to the power supply that supplies the operational voltage VCC. The reference currents IREF1, . . . , and IREFn are generated at the drains of the transistors M301, . . . , and M30n, respectively. In one example, the values of the reference currents IREF1, . . . , and IREFn all have the same current value IREF. The current value IREF is equivalently expressed with the equation described below.

$$IREF = IB \times K2 \quad \text{(equation 3)}$$

In equation 3, k2 is the current ratio coefficient representing the reference current value IREF for the current value IB. Equation 3 is converted into the equation shown below based on equation 1 and equation 2.

$$IREF = I\_IN \times K2/(1 + DATA \times K1) \quad \text{(equation 4)}$$

Equation 4 suggests that an error occurs in the reference current value IREF if an error occurs in the value of the input current I_IN of the DAC 100. In this case, the reference current value IREF err of when an error ERR occurs in the input current I_IN is expressed with the equation described below.

$$IREF\_err = I\_IN \times (1 + ERR) \times K2/(1 + DATA \times K1) \quad \text{(equation 5)}$$

The reference current generation circuit 60 generates the target reference current value IREF by canceling the error (IREF-IREF_err) of the reference current value IREF_err using the correction value DATA_adj of the digital code DATA. Specifically, the target reference current value IREF is obtained with the equation shown below by applying the correction value DATA_adj to equation 5.

$$IREF = I\_IN \times (1 + ERR) \times K2/(1 + (DATA + DATA\_adj) \times K1) \quad \text{(equation 6)}$$

From equation 6 and equation 4, the correction value DATA_adj is expressed with the equation shown below.

$$DATA\_adj = ERR \times (1/K1 + DATA) \quad \text{(equation 7)}$$

It is apparent from equation 7 that the correction value DATA_adj is proportional to the error ERR. Thus, the error ERR may be corrected in equally spaced steps in accordance with the resolution of the DAC 100 using the correction value DATA_adj. This cancels the error of the reference current value IREF_err.

It should be apparent to those skilled in the art that the present invention may be embodied in many other specific forms without departing from the spirit or scope of the invention. Particularly, it should be understood that the present invention may be embodied in the following forms.

Each transistor of the DAC 10 may be formed by a bipolar transistor instead of the MOS transistor. The number of current supply transistors connected in series to each of the DAC units 501, . . . , and 50n may be two or more.

The present examples and embodiments are to be considered as illustrative and not restrictive, and the invention is not to be limited to the details given herein, but may be modified within the scope and equivalence of the appended claims.

What is claimed is:

1. A digital-to-analog converter for generating an output current corresponding to a digital code, the digital-to-analog converter comprising:
    a current supply transistor that generates current having a predetermined current value; and
    a DAC unit, connected to the current supply transistor, that receives the current generated by the current supply transistor, with the DAC unit including:
    a plurality of first control transistors connected in parallel to each other, in which each of the plurality of first control transistors is connected in series to the current supply transistor, and the plurality of first control transistors drive currents having different current values in response to a single bias voltage; and
    a plurality of second control transistors connected in parallel to each other, in which each of the plurality of second control transistors being connected in series to the current supply transistor and driving current having a current value that is the same as one of the plurality of first control transistors in response to the single bias voltage;
    wherein the first and second control transistors that drive the currents having the same current value operate in a complementary manner based on part of the digital code, and the DAC unit generates the output current by selectively combining at least one of the currents driven by the plurality of first control transistors, and further comprising
    a current adjustment transistor connected in series between the current supply transistor and ground to retrieve some of the current flowing to the current supply transistor and adjust the amount of output current of the DAC unit.

2. The digital-to-analog converter of claim 1, wherein the plurality of first control transistors are formed having different sizes, and the plurality of second control transistors are each formed having a size that is the same as one of the plurality of first control transistors.

3. The digital-to-analog converter of claim 2, wherein the current value of the current flowing through the current supply transistor is determined by the size of the plurality of first control transistors.

4. The digital-to-analog converter of claim 2, wherein the single bias voltage is determined by the size of the one of the plurality of first control transistors having the largest size.

5. The digital-to-analog converter of claim 1, wherein each of the plurality of first control transistors and each of the plurality of second control transistors are cascode-connected to the current supply transistor.

6. The digital-to-analog converter of claim 1, wherein the current value of the current supply transistor remains constant regardless of a change in value of the digital code.

7. The digital-to-analog converter of claim 6, wherein:
the DAC unit includes a current input terminal, which receives the current generated by the current supply transistor, and a current output terminal, which outputs the output current;
the plurality of first control transistors each include a first terminal, which is connected to the current input terminal of the DAC unit, and a second terminal, which is connected to the current output terminal of the DAC unit; and
the plurality of second control transistors each include a first terminal, which is connected to the current input terminal of the DAC unit, and a second terminal, which is connected to ground.

8. The digital-to-analog converter of claim 7, wherein the current supply transistor includes a first terminal, which is connected to an operational power supply of the DAC, and a second terminal, which is connected to the first terminal of each of the plurality of first control transistors and the first terminal of each of the plurality of second control transistors, and generates a current that is greater than or equal to a sum of every one of the currents driven by the plurality of first control transistors.

9. The digital-to-analog converter of claim 1, further comprising a bias circuit including at least one bias adjustment transistor, in which one of the at least one of the bias adjustment transistors generates the single bias voltage.

10. The digital-to-analog converter of claim 1, wherein the digital code includes a plurality of bits, and the DAC unit generates part of the output current in response to the value of at least two of the plurality of bits.

11. A digital-to-analog converter for generating an output current corresponding to a digital code, the digital- to-analog converter comprising:
a first current supply transistor that generates a first supply current;
a second current supply transistor that generates a second supply current;
a first DAC unit that generates a first output current and includes at least first and second control transistors, in which the first and second control transistors operate in a complementary manner based on a first portion of the digital code and retrieves at least some of the first supply current from the first current supply transistor to generate a first drive current in response to a first bias voltage, and the first control transistor outputs the first drive current as at least some of the first output current; and
a second DAC unit that generates a second output current and includes at least third and fourth control transistors, in which the third and the fourth control transistors operate in a complementary manner based on a second portion of the digital code and retrieves at least some of the second supply current from the second current supply transistor to generate a second drive current in response to a second bias voltage, and the third control transistor outputs the second drive current as at least some of the second output current, wherein the first output current and the second output current are selectively combined to generate the output current of the digital-to-analog converter; and further comprising:
a first current adjustment transistor which is connected in series to the first supply transistor to adjust an amount of the first output current; and
a second current adjustment transistor which is connected in series to the second supply transistor to adjust an amount of the second output current.

12. The digital-to-analog converter of claim 11, wherein:
the first current supply transistor keeps the first supply current constant at a first current value regardless of a change in value of the first portion of the digital code; and
the second current supply transistor keeps the second supply current constant at a second current value that is greater than the first current value regardless of a change in value of the second portion of the digital code.

13. The digital-to-analog converter of claim 11, wherein each of the first and second control transistors is connected in series to the first current supply transistor, and each of the third and the fourth control transistors is connected in series to the second current supply transistor.

14. The digital-to-analog converter of claim 11, further comprising:
a first bias adjustment transistor which generates the first bias voltage; and
a second bias adjustment transistor which generates the second bias voltage.

15. The digital-to-analog converter of claim 11, wherein:
the first DAC unit further includes first and second switching transistors, which are connected in series to each other and activated in a complementary manner, and third and fourth switching transistors, which are connected in series to each other and activated in a complementary manner, with the first bias voltage being supplied to the second control transistor through the fourth switching transistor when the first and fourth switching transistors are activated, and the first bias voltage being supplied to the first control transistor through the second switching transistor when the second and the third switching transistors are activated; and
the second DAC unit includes fifth and sixth switching transistors, which are connected in series to each other and activated in a complementary manner, and seventh and eighth switching transistors, which are connected in series to each other and activated in a complementary manner, with the second bias voltage being supplied to the fourth control transistor through the eighth switching transistor when the fifth and the eighth switching transistors are activated, and the second bias voltage being supplied to the third control transistor through the sixth switching transistor when the sixth and the seventh switching transistors are activated.

16. A reference current generation circuit, comprising:
a digital-to-analog converter that generates an output current corresponding to a digital code based on an input current; and
a reference current generation unit that generates a reference current based on a difference of the input current and the output current;
wherein the digital-to-analog converter corrects an error of the input current based on a correction value of the digital code so as to cancel an error in the reference current.

17. The reference current generation circuit according to claim 16, wherein the digital-to-analog converter includes:
a current supply transistor which generates current having a predetermined current value; and
a DAC unit which receives the current generated by the current supply transistor, with the DAC unit including:
a plurality of first control transistors connected in parallel to each other, in which each of the plurality of first control transistors is connected in series to the current supply transistor, and the plurality of first control transistors drive currents having different current values in response to a single bias voltage; and
a plurality of second control transistors connected in parallel to each other, in which each of the plurality of second control transistors being connected in series to the current supply transistor and driving current having a current value that is the same as one of the plurality of first control transistors in response to the single bias voltage;
wherein the first and second control transistors that drive the currents having the same current value operate in a complementary manner based on part of the digital code, and the DAC unit generates the output current by selectively combining at least one of the currents driven by the plurality of first control transistors.

18. The reference current generation circuit according to claim 16, wherein the digital-to-analog converter includes:
a first current supply transistor that generates a first supply current;
a second current supply transistor that generates a second supply current;
a first DAC unit that generates a first output current and includes at least first and second control transistors, in which the first and second control transistors operate in a complementary manner based on a first portion of the digital code and retrieves at least some of the first supply current from the first current supply transistor to generate a first drive current in response to a first bias voltage, and the first control transistor outputs the first drive current as at least some of the first output current; and
a second DAC unit that generates a second output current and includes at least third and fourth control transistors, in which the third and the fourth control transistors operate in a complementary manner based on a second portion of the digital code and retrieves at least some of the second supply current from the second current supply transistor to generate a second drive current in response to a second bias voltage, and the third control transistor outputs the second drive current as at least some of the second output current, wherein the first output current and the second output current are selectively combined to generate the output current of the digital-to-analog converter.

* * * * *